(12) United States Patent
Savoy et al.

(10) Patent No.: US 11,152,556 B2
(45) Date of Patent: Oct. 19, 2021

(54) FLEXIBLE AND CONFORMABLE THERMOELECTRIC COMPOSITIONS

(71) Applicant: Nanohmics, Inc., Austin, TX (US)

(72) Inventors: Steve M Savoy, Austin, TX (US); Giri Joshi, Austin, TX (US); Joshua C Ruedin, Austin, TX (US); Michael McAleer, Austin, TX (US)

(73) Assignee: Nanohmics, Inc., Austin, TX (US)

( * ) Notice: Subject to any disclaimer, the term of this patent is extended or adjusted under 35 U.S.C. 154(b) by 10 days.

(21) Appl. No.: 16/048,337

(22) Filed: Jul. 29, 2018

(65) Prior Publication Data

US 2019/0035997 A1   Jan. 31, 2019

Related U.S. Application Data

(60) Provisional application No. 62/538,692, filed on Jul. 29, 2017.

(51) Int. Cl.
*H01L 35/32* (2006.01)
*H01L 35/10* (2006.01)

(52) U.S. Cl.
CPC ............ *H01L 35/32* (2013.01); *H01L 35/10* (2013.01)

(58) Field of Classification Search
None
See application file for complete search history.

(56) References Cited

U.S. PATENT DOCUMENTS

| | | |
|---|---|---|
| 3,601,887 A | 8/1971 | Mitchell |
| 4,151,008 A | 4/1979 | Kirkpatrick |
| 4,585,002 A | 4/1986 | Kissin |
| 4,902,648 A | 2/1990 | Ohta et al. |
| 6,127,619 A | 10/2000 | Xi et al. |
| 6,700,052 B2 | 3/2004 | Bell |
| 6,858,154 B2 | 2/2005 | Suzuki et al. |

(Continued)

FOREIGN PATENT DOCUMENTS

| | | |
|---|---|---|
| AU | 2013257243 B2 | 6/2017 |
| EP | 0455051 A2 | 6/1991 |

(Continued)

OTHER PUBLICATIONS

Extended European Search Report dated Oct. 26, 2018 for European Application 18181650.5-1211.

(Continued)

*Primary Examiner* — Shannon M Gardner
(74) *Attorney, Agent, or Firm* — Murphy Strategic IP; George L. Murphy

(57) ABSTRACT

The invention relates to the field of thermoelectric compositions and devices. Thermoelectric compositions comprise thermoelectric material in a flexible membrane that comprises structural material and voids. Thermoelectric subassemblies comprise thermoelectric material and electrical contact material along and on and surrounding structural material of the flexible membrane. Thermoelectric subassemblies can comprise thermoelectric elements positioned end-to-end in a flexible membrane that can be bent and positioned in a housing that can be adapted to accommodate various types of thermoelectric devices. Methods for making and using thermoelectric compositions, subassemblies, and devices are described.

15 Claims, 6 Drawing Sheets

(56) References Cited

U.S. PATENT DOCUMENTS

| | | | |
|---|---|---|---|
| 6,872,879 | B1 | 3/2005 | Serras et al. |
| 7,235,912 | B2 | 6/2007 | Sung |
| 7,309,830 | B2 | 12/2007 | Zhang et al. |
| 7,365,265 | B2 | 4/2008 | Heremans et al. |
| 7,591,913 | B2 | 9/2009 | Ren et al. |
| 7,649,139 | B2 | 1/2010 | Mihara et al. |
| 7,765,811 | B2 | 8/2010 | Hershberger et al. |
| 7,812,726 | B2 | 10/2010 | Barlow, Jr. et al. |
| 7,820,097 | B2 | 10/2010 | Schroder et al. |
| 7,834,263 | B2 | 11/2010 | DeSteese et al. |
| 7,879,734 | B2 | 2/2011 | Fukutani et al. |
| 7,888,169 | B2 | 2/2011 | Mohapatra et al. |
| 7,906,223 | B2 | 3/2011 | Rakow et al. |
| 9,064,994 | B2 | 6/2015 | Shelby et al. |
| 2002/0026226 | A1 | 2/2002 | Ein |
| 2006/0118158 | A1 | 6/2006 | Zhang et al. |
| 2007/0240749 | A1 | 10/2007 | Ohtaki |
| 2007/0277866 | A1 | 12/2007 | Sander et al. |
| 2008/0087314 | A1 | 4/2008 | Xiao et al. |
| 2008/0121263 | A1* | 5/2008 | Schutte ............... H01L 35/32 136/203 |
| 2008/0128013 | A1 | 6/2008 | Lopatin et al. |
| 2008/0173344 | A1 | 7/2008 | Zhang et al. |
| 2008/0274004 | A1 | 11/2008 | Miner |
| 2008/0286488 | A1 | 11/2008 | Li et al. |
| 2009/0014046 | A1 | 1/2009 | Yu et al. |
| 2009/0025774 | A1 | 1/2009 | Plissonnier et al. |
| 2009/0084423 | A1 | 4/2009 | Horio |
| 2009/0151767 | A1 | 6/2009 | Sharifi et al. |
| 2009/0181172 | A1 | 7/2009 | Parpia et al. |
| 2009/0274833 | A1 | 11/2009 | Li et al. |
| 2009/0277489 | A1 | 11/2009 | Dannoux et al. |
| 2010/0147348 | A1 | 6/2010 | Backhaus-Ricoult |
| 2010/0147350 | A1 | 6/2010 | Chou et al. |
| 2010/0206349 | A1 | 8/2010 | Lee et al. |
| 2010/0236596 | A1 | 9/2010 | Lee et al. |
| 2010/0291724 | A1 | 11/2010 | Landry et al. |
| 2011/0000516 | A1 | 1/2011 | Hershberger et al. |
| 2011/0016888 | A1 | 1/2011 | HaaB et al. |
| 2013/0218241 | A1 | 8/2013 | Savoy et al. |
| 2014/0246066 | A1 | 9/2014 | Chen et al. |
| 2015/0179911 | A1 | 6/2015 | Lemmer et al. |
| 2015/0219368 | A1 | 8/2015 | Makansi et al. |
| 2015/0311421 | A1 | 10/2015 | Jur et al. |
| 2016/0035956 | A1 | 2/2016 | Carroll et al. |
| 2016/0056360 | A1 | 2/2016 | Cho et al. |

FOREIGN PATENT DOCUMENTS

| | | | |
|---|---|---|---|
| EP | 0805501 | A1 | 11/1997 |
| EP | 1187230 | A2 | 3/2002 |
| EP | 1831432 | B1 | 2/2015 |
| EP | 2815440 | B1 | 7/2018 |
| EP | 3373335 | A2 | 9/2018 |
| EP | 3407399 | B1 | 4/2020 |
| JP | 11317547 | A | 11/1999 |
| WO | 2005011959 | A1 | 2/2005 |
| WO | 2005090055 | A1 | 9/2005 |
| WO | 2006071419 | A2 | 7/2006 |
| WO | 2007114895 | A2 | 10/2007 |
| WO | 2008054910 | A2 | 5/2008 |
| WO | 2008127350 | A1 | 10/2008 |
| WO | 2008144504 | A1 | 11/2008 |
| WO | 2009052120 | A1 | 4/2009 |
| WO | 2009085089 | A1 | 7/2009 |
| WO | 2009140730 | A1 | 11/2009 |
| WO | 2010048066 | A2 | 4/2010 |
| WO | 2010107822 | A2 | 9/2010 |
| WO | 2010107824 | A1 | 9/2010 |
| WO | 2010114769 | A1 | 10/2010 |
| WO | 2013009712 | A2 | 1/2013 |
| WO | 2017059392 | A1 | 4/2017 |

OTHER PUBLICATIONS

Office Action issued in U.S. Appl. No. 13/398,567, dated Jul. 20, 2018 (14.1001.13).
Response to Office Action issued in U.S. Appl. No. 13/398,567, filed Nov. 19, 2018 (14.1001.13).
Office Action issued in U.S. Appl. No. 13/398,567, dated Dec. 13, 2017 (14.1001.13).
Response to Office Action issued in U.S. Appl. No. 13/398,567, filed Apr. 13, 2018 (14.1001.13).
Examiner's Interview Summary PTOL-413 issued in U.S. Appl. No. 13/398,567, dated Apr. 4, 2018 (14.1001.13).
Communication Intent to Grant issued in European Application No. 13 753 213.1-1555 dated Aug. 30, 2017.
Office Action issued in U.S. Appl. No. 13/398,567, dated Jun. 15, 2017 (14.1001.13).
Interview Agenda in U.S. Appl. No. 13/398,567, mail room date Jul. 27, 2017 (14.1001.13).
Examiner's Interview Summary PTOL-413 issued in U.S. Appl. No. 13/398,567, dated Jul. 27, 2018 (14.1001.13).
Response to Office Action issued in U.S. Appl. No. 13/398,567, filed Sep. 1, 2017 (14.1001.13).
Notice of Acceptance for Patent Application in Australia Application No. 2013257243 dated May 31, 2017. (43494NAN/BMN).
Office Action issued in Australia Application No. 2013257243 dated Oct. 14, 2016. (43494NAN/BMN).
Communication issued in Europe Application No. 13 753 213.1 dated Feb. 23, 2017 (NMIC/0004EPX).
Office Action issued in U.S. Appl. No. 13/398,567, dated Jan. 12, 2017 (14.1001.13).
Response to Office Action issued in U.S. Appl. No. 13/398,567, filed Apr. 12, 2017 (14.1001.13).
Office Action issued in U.S. Appl. No. 13/398,567, dated Jun. 28, 2016 (14.1001.13).
AFCP Response to Office Action issued in U.S. Appl. No. 13/398,567, filed Aug. 27, 2016 (14.1001.13).
Advisory Action issued in U.S. Appl. No. 13/398,567, dated Sep. 21, 2016 (14.1001.13).
Response to Office Action issued in U.S. Appl. No. 13/398,567, filed Sep. 28, 2016 (14.1001.13).
Office Action issued in U.S. Appl. No. 13/398,567, dated Nov. 20, 2015 (14.1001.13).
Response to Office Action issued in U.S. Appl. No. 13/398,567, filed Mar. 21, 2016 (14.1001.13).
Office Action issued in U.S. Appl. No. 13/398,567, dated Jan. 11, 2019 (14.1001.13).
International Search Report and Written Opinion for PCT Application PCT/US2013/025785 dated Jan. 27, 2014.
Communication issued in Europe Application No. 13 753 213.1 dated Sep. 26, 2014 (NMIC/0004EPX).
Response to Communication issued in Europe Application No. 13 753 213.1 filed filed Feb. 20, 2015 (NMIC/0004EPX).
Communicaiton issued in Europe Application No. 13 753 213.1 dated Feb. 23, 2017 (NMIC/0004EPX).
Response to Communication issued in Europe Application No. 13 753 213.1 filed filed Jun. 23, 2017 (NMIC/0004EPX).
Communication issued in Europe Application No. 13 753 213.1-1555 dated Jan. 23, 2018.
Response to Communicaiton issued in Europe Application No. 13 753 213.1-1555 dated May 28, 2018.
Communication (Decision to Grant) issued in Europe Application No. 13 753 213.1-1555 dated Jun. 14, 2018.
Notice of Grant in AU Application No. 2013257243 dated Sep. 28, 2017 (43494NAN/BMN).
Office Action issued in AU Application No. 2013257243 dated Oct. 14, 2016 (43494NAN/BMN).
Response to Office Action issued in AU Application No. 2013257243 filed May 10, 2014 (43494NAN/BMN).
Snyder, G et al. "Complex thermoelectric materials" Nature Materials, Feb. 2008, vol. 7, pp. 105-114.
Panico, L; Xenon Corporation, Center for the Advancement of Printed Electronics. Photonic Curing-Pulsed Lisght as Low Temperature Sintering Process, pp. 1-15, Available as of Oct. 18, 2012.

(56) References Cited

OTHER PUBLICATIONS

Liang et al, "Flexible Nanocrystal-Coated Glass Fibers for High-Performance Thermoelectric Energy Harvesting", NANOLetters, 2012, vol. 12, pp. 2140-2145.
Chen et al, "Nanostructured thermoelectricmaterials:Current research and future challenge" Progress in Nat Sci:Mater Intl, 2012, vol. 22(6), pp. 535-549.
Li et al, "High-performance nanostructured thermoelectric materials", NPG Asia Mater, 2010, vol. 2(4), pp. 152-158.
Wu et al, "A novel design for a wearable thermoelectric generator based on 3D fabric structure", Smart Mater Struct, Mar. 24, 2017, vol. 26, pp. 045037(8 pp).
Response to Office Action issued in U.S. Appl. No. 13/398,567, filed May 10, 2019 (14.1001.13).
Kim et al, "A wearable thermoelectric generator fabricated on a glass fabric", Energy Environ Sci, 2014, vol. 7, pp. 1959-1965.
Yang et al, "Nanostructured Thermoelectric Materials: From Superlattices to Nanocomposites", 2006, Mater. Integr. vol. 18.
Communication under Rule 71(3) EPC dated Oct. 4, 2019 for European Application 18181650.5-1211.
Annex to Communication pursuant to Rule 71(3) dated Oct. 4, 2019 for European Application 18181650.5-1211.
Notice of Preliminary Rejection [English Translation] dated Apr. 3, 2019 for Korean Application 10-2014-7024666.
Communication from EPO dated May 15, 2019 for European Application 18181650.5-1211.
Office Action issued in U.S. Appl. No. 13/398,567, dated Jul. 26, 2019 (14.1001.13).
Response to Office Action issued in U.S. Appl. No. 13/398,567, filed Jan. 24, 2020 (14.1001.13).
Response to Communication under Rule 71(3) EPC in European Application 18181650.5-1211, filed Feb. 4, 2020.
Decision to grant a European patent pursuant to Article 97(1) EPC based on European Application 18181650.5-1211, dated Mar. 12, 2020.
Office Action issued in U.S. Appl. No. 13/398,567, dated Mar. 19, 2020 (14.1001.13).
Exhibit 1 in Response to Office Action issued in U.S. Appl. No. 13/398,567, filed Jan. 24, 2020 (14.1001.13)—"What is the difference between crystallite size, grain size, and particle size" @ www.researchgate.net/post/What_is_the_difference_between_crystallite_size_grain_size_and_particle_size; (Aug. 10, 2012).
Exhibit 2 in Response to Office Action issued in U.S. Appl. No. 13/398,567, filed Jan. 24, 2020 (14.1001.13)—Sultana et al., "Crystal Growth and Characterization of Bulk Sb2Te3Topological Insulator", Mat. Res. Exp. 5, 046107 (2018).
Exhibit 3 in Response to Office Action issued in U.S. Appl. No. 13/398,567, filed Jan. 24, 2020 (14.1001.13)—Kokh et al., "Melt growth of bulk Bi2Te3 crystals with a natural p-n junction", Cryst Eng Comm,—vol. 16, pp. 581-584, (Jan. 2014).
Response to Office Action issued in U.S. Appl. No. 13/398,567, filed Sep. 18, 2020 (14.1001.13).
Office Action issued in U.S. Appl. No. 13/398,567, dated Nov. 16, 2020 (14.1001.13).
Notice of Appeal filed in U.S. Appl. No. 13/398,567, filed Mar. 3, 2021.
Notice of References Cited (PTO-892), Office Action issued in U.S. Appl. No. 13/398,567, dated Nov. 16, 2020 (14.1001.13).

* cited by examiner

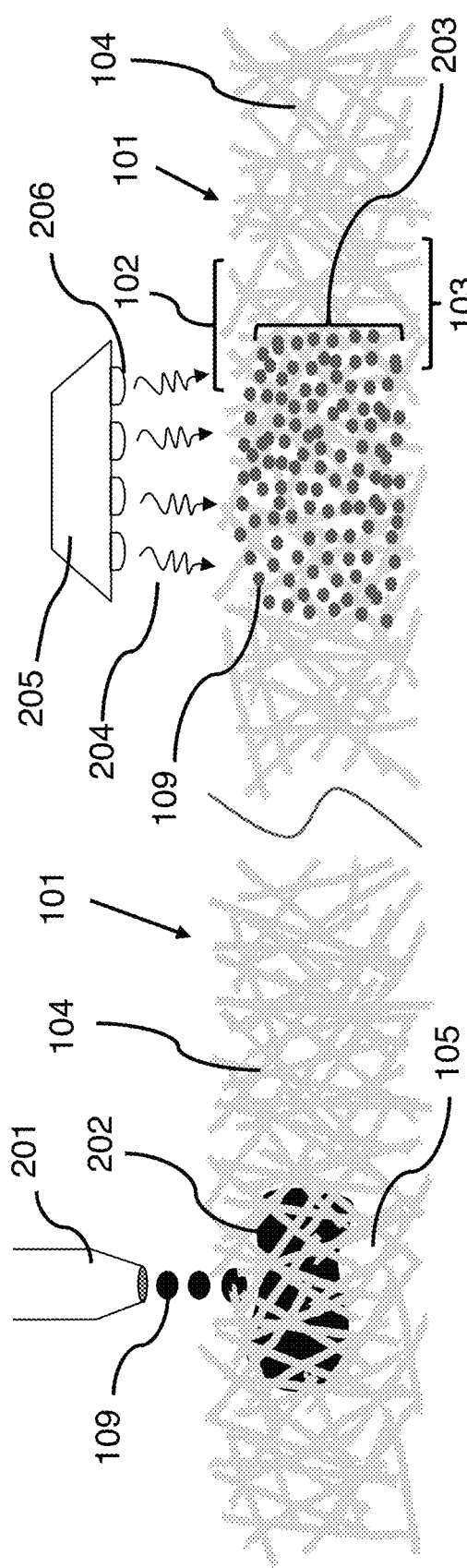
FIG. 2A
FIG. 2B
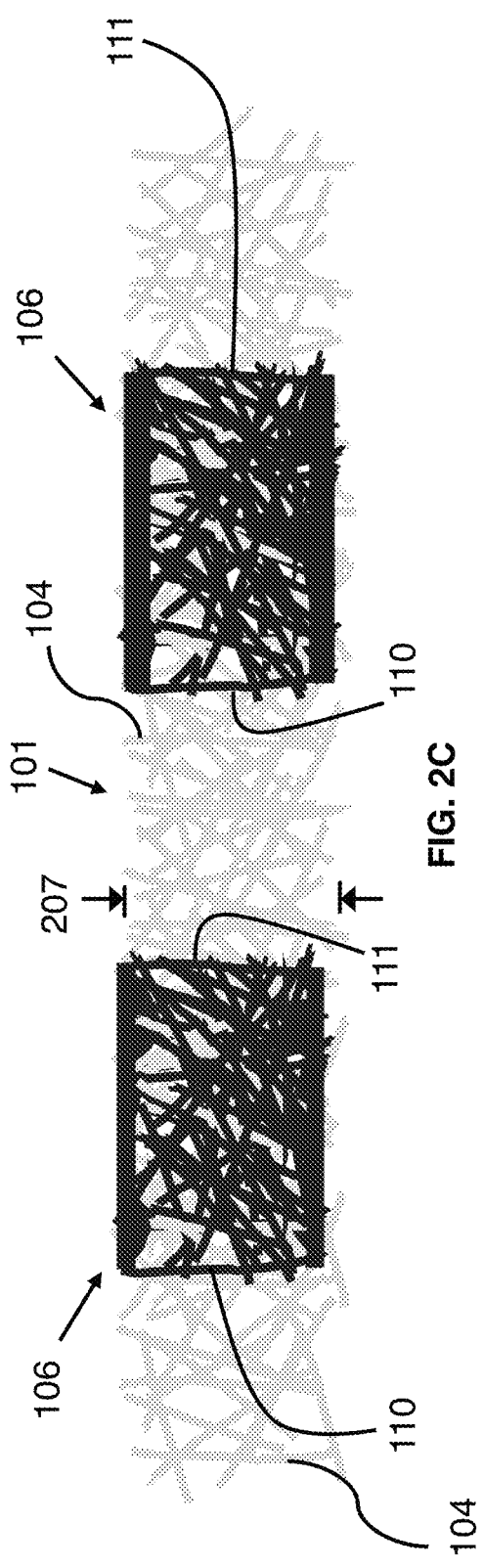
FIG. 2C

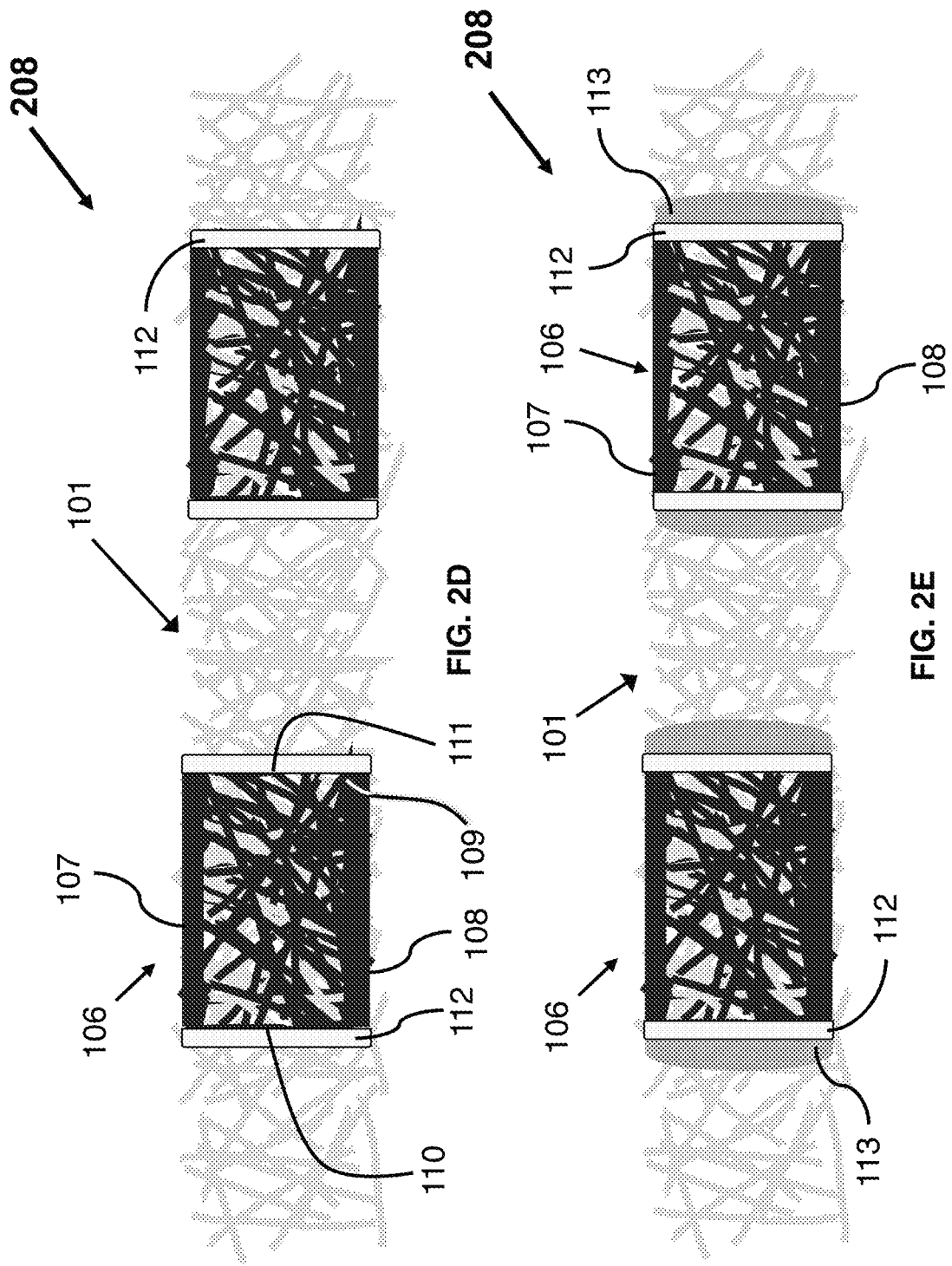

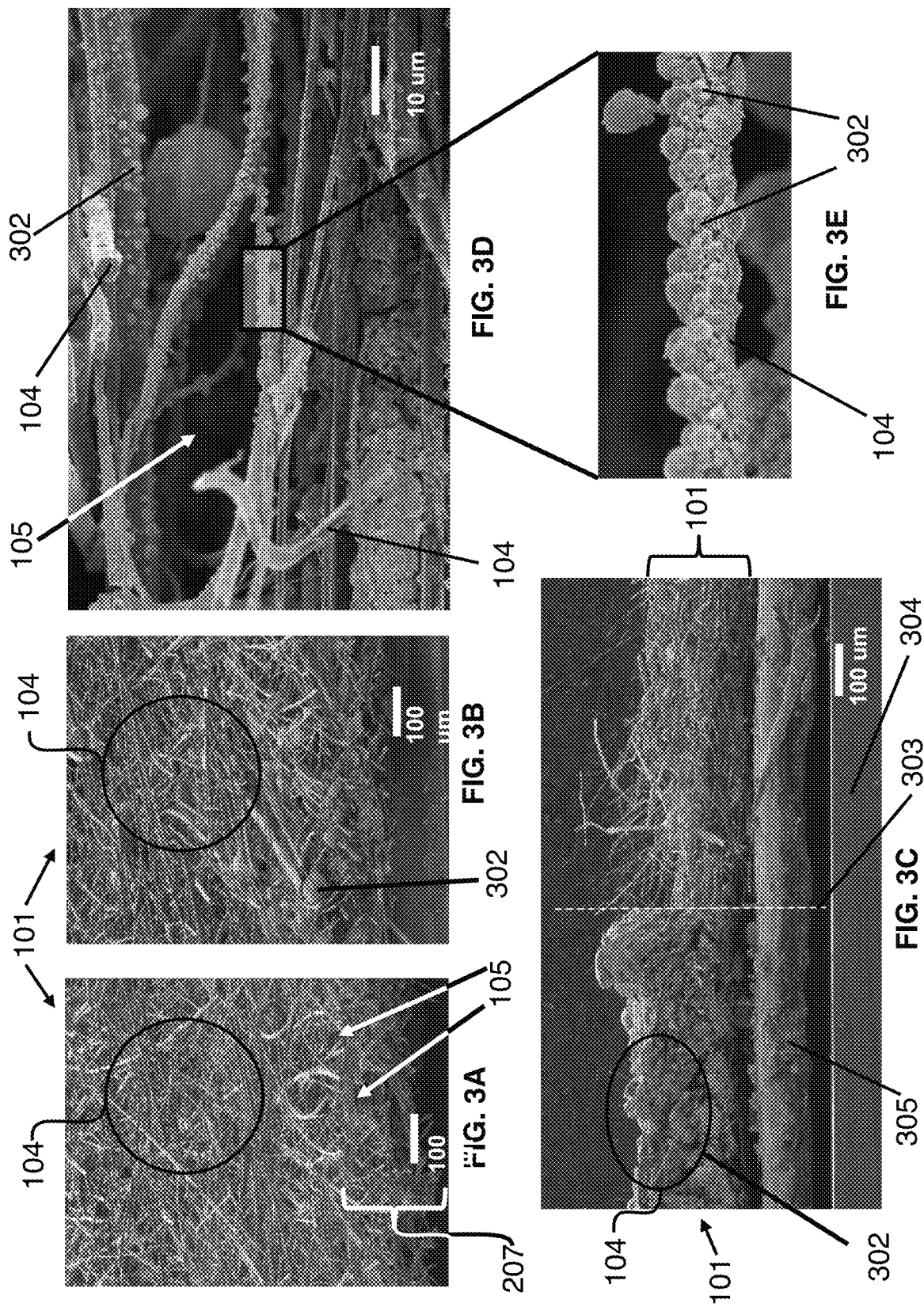

FLEXIBLE AND CONFORMABLE THERMOELECTRIC COMPOSITIONS

STATEMENT REGARDING FEDERALLY SPONSORED RESEARCH

The invention was made, in part, with government support under Contract No. NNX17CP04C awarded by NASA. The government has certain rights in the invention.

FIELD OF THE INVENTION

The invention relates to the field of thermoelectric devices. Thermoelectric compositions and devices formed with a porous membrane, and methods for making and using such compositions and devices are described.

GENERAL DESCRIPTION

The thermoelectric effect is the conversion between temperature difference and electric potential or vice versa. Thermoelectric Generators (TEGs), which operate under the principles of the Seebeck effect, generate an electric current from temperature differences, and conversely, Thermoelectric Coolers (TECs), which operate under the principles of the Peltier effect, generate a temperature difference with applied electric current. TEG and TEC devices are commercially available and are generally composed of alternating n-type and p-type semiconductor material referred to as Thermoelectric Elements (TEEs). Commercial TEEs can be composed of thin film, epitaxial layers or bulk materials such as extruded ingots that are cut to size and mechanically assembled on rigid ceramic substrates to form Thermoelectric Modules (TEMs). Conventional methods for manufacturing bulk TEEs have included melt extrusion in the form of single and polycrystalline phases followed by mechanical processing to the desired shape of the TEE prior to placement in a TEM. Alternative manufacturing approaches include vacuum deposition such as sputtering, electroplating, electrochemical and other slurry packing and compaction methods followed by sintering thermoelectric powder material at high temperature and high pressure. Commercial TEC/TEG devices often are mechanically assembled TEMs composed of semiconductor TEEs that are cuboid, arrayed, and capped with rigid ceramic plates as the substrate that bears a patterned serpentine electrode for application or collection of the electric current. The TEM is mechanically assembled into an arrangement of TEEs with alternating polarity (i.e., p-type and n-type) that are coated with a low contact resistance layer and bonded to electrodes.

A need exists for thermoelectric compositions, modules, and devices having novel geometries and materials to enable the development and adoption of flexible TEC and TEG devices for a wide variety of specialized applications. Such devices should have high flexibility and conformability and high coefficients of performance. Exemplary applications include thermoelectric clothing and fabrics, heating and cooling body parts, vehicular and commercial waste heat energy recovery; spacecraft applications; and lightweight, low density "open mesh" thermal interface and thermal boundary structures.

Embodiments of the disclosure, include thermoelectric compositions, assemblies, and devices having sintered thermoelectric material in TEEs formed in a porous membrane. In some embodiments, a thermoelectric composition can be made by dispensing thermoelectric material or a slurry of material in a porous membrane and sintering the thermoelectric material with a high-power pulsed irradiance. TEEs can be initially formed as electrically isolated elements in a porous membrane and can be subsequently electrically connected to form various types of TEMs. These TEMs and the TEDs prepared with them can be flexible and conformable to differently shaped structures and are useful in applications benefiting from flexibility and conformability and, in some aspects, other applications where such flexibility and conformability may not be required. U.S. Pat. App. Pub. 20130218241 (Savoy et al.), which is incorporated by reference herein in its entirety, describes methods for making novel TEEs with the enhanced thermoelectric properties of nanopowder thermoelectric materials and flexible TEC and TEG devices comprising the novel TEEs.

In some embodiments, a membrane-supported thermoelectric subassembly comprises a flexible porous membrane comprising structural material and voids and having a top face and a bottom face; a plurality of electrically isolated thermoelectric elements, each element comprising a top, a bottom, a first lateral face, a second lateral face, the lateral faces positioned on opposite sides of the thermoelectric element, and thermoelectric material positioned at least partially within the membrane and along and on and surrounding structural material of the membrane; and electrical contact material disposed at the lateral faces for electrically connecting selected thermoelectric elements, the electrical contact material being along and on and surrounding structural material of the membrane, wherein each element has a doping type selected to be n-type or p-type.

In some embodiments, thermoelectric material in a thermoelectric element may extend through the membrane to one or both of the membrane top face and bottom face. In some embodiments, thermoelectric material is not exposed at the membrane top face and/or bottom face and the element top, the element bottom, or both the element top and the element bottom are positioned within the porous membrane. In some aspects, one or more thermoelectric elements comprise an element top positioned outside the porous membrane, an element bottom positioned outside the porous membrane, or both an element top and an element bottom positioned outside the porous membrane.

In some embodiments, the thermoelectric elements can be positioned in the porous membrane in an end-to-end configuration, such that a lateral face of each thermoelectric element is positioned across from a lateral face of an adjacent thermoelectric element. In some aspects, the electrical contact material spans the entire distance between adjacent thermoelectric elements. In some aspects, electrical contact material and/or thermoelectric material can be flexible.

Other embodiments are discussed throughout this application. It is contemplated that any embodiment discussed herein can be implemented with respect to any method or composition of the invention, and vice versa. Compositions of the invention can be used to achieve methods of the invention.

The specification is most thoroughly understood in light of the teachings and references cited within the specification. It should be understood that the drawings, detailed description, and specific examples, while indicating specific embodiments of the invention, are given by way of illustration only, since various changes and modifications within the spirit and scope of the invention will become apparent from this detailed description to those skilled in the art.

Any section headings used herein are for organizational purposes only and are not to be construed as limiting the subject matter described. All documents, or portions of documents, cited in this application, including but not limited to patents, patent applications, articles, books, and treatises, are hereby expressly incorporated by reference in their entirety for any purpose. To the extent publications and patents or patent applications incorporated by reference contradict the invention contained in the specification, the specification will supersede any contradictory material.

BRIEF DESCRIPTION OF THE DRAWINGS

The following drawings form part of the present specification and are included to further demonstrate certain aspects of the invention. Embodiments of the invention may be better understood by reference to one or more of these drawings in combination with the detailed description of specific embodiments presented herein.

FIG. 2A-2E is a schematic diagram showing a cross sectional view of one embodiment of a method of making an exemplary thermoelectric composition.

FIG. 3A-3E is a series of scanning electron photomicrographs depicting the results of photonic sintering of thermoelectric material into consolidated thermoelectric material.

DETAILED DESCRIPTION

Figure 1A:
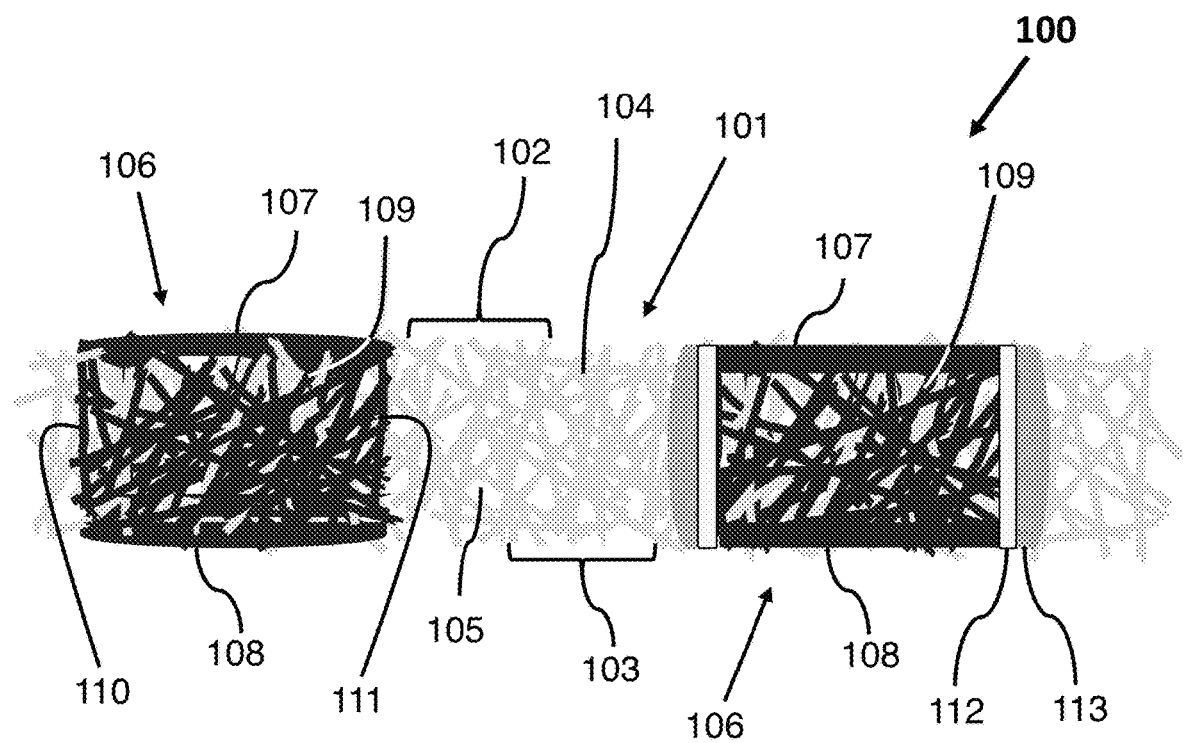
FIG. 1A-1B is a schematic diagram depicting a cross sectional view of exemplary embodiments of thermoelectric elements and compositions.

Reference will now be made in detail to certain exemplary embodiments, some of which are illustrated in the accompanying drawings. Certain terms used in the application are first defined. Additional definitions are provided throughout the application.

The use of the word "a" or "an" when used in conjunction with the term "comprising" in the claims and/or the specification may mean "one," but it is also consistent with the meaning of "one or more," "at least one," and "one or more than one.".

Throughout this application, the term "about" is used to indicate that a value includes the standard deviation of error for the device or method being employed to determine the value. As used herein. "substantially" is meant to mean "approximately", not necessarily "perfectly".

The use of the term "or" in the claims is used to mean "and/or" unless explicitly indicated to refer to alternatives only or the alternatives are mutually exclusive, although the disclosure supports a definition that refers to only alternatives and "and/or."

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The compositions and methods for their use can "comprise," "consist essentially of," or "consist of" any of the compositions or steps disclosed throughout the specification.

As used herein, "thermoelectric membrane", "membranous thermoelectric device", "membrane-supported thermoelectric composition", "thermoelectric assembly" and various combinations of these terms can refer to a membrane having two faces, a top face and a bottom face, and comprising thermoelectric materials positioned at least partially within an electrically insulating porous membrane. A membrane-supported thermoelectric composition may comprise thermoelectric elements and other thermoelectric material in other conformations, e.g., thermoelectric elements having electrical contact material and leads for electrically connecting selected thermoelectric elements.

Some embodiments of the disclosure are directed to membranous thermoelectric devices made with a porous membrane. As used herein, "membrane", "porous membrane", and "porous, membrane matrix", can refer to a flexible sheet comprising a material or a composite of materials that forms a porous membrane. "Sheet" is used herein to refer to a flat composition that is thin relative to its length and width and is used interchangeably with "strip", "ribbon", or "film" for referring to a sheet. The lateral dimensions of a sheet of membrane can range from tens or hundreds of micrometers up to hundreds of meters in width depending on the intended application.

In some embodiments, a porous membrane may comprise a structural or skeletal material and open spaces or voids among the structural material. In some embodiments, open spaces or voids among the structural material may be referred to herein as "pores". The term "membrane structural material", refers to the structural or skeletal material that makes up the structural or non-porous component of a porous membrane. In some embodiments, an exemplary porous membrane is a fiberglass membrane, comprising a membrane structural material that is fiberglass and open spaces (voids or pores) dispersed among the structural fiberglass. In some embodiments, the membrane structural material can comprise one or more materials and/or material classes including glass/ceramic fibers, synthesized polymers (e.g., polyester, polypropylene, nitrocellulose, etc.), natural fibers such as cotton, glass/ceramic composites, glass/polymer composites, fiberglass/aerogel blankets (e.g., Aspen Aerogels, Northborough, Mass., USA) and fiberglass/polymer (e.g., FUSION 5™, Whatman Inc.) providing low thermal conductance across the porous membrane.

Figure 1B:
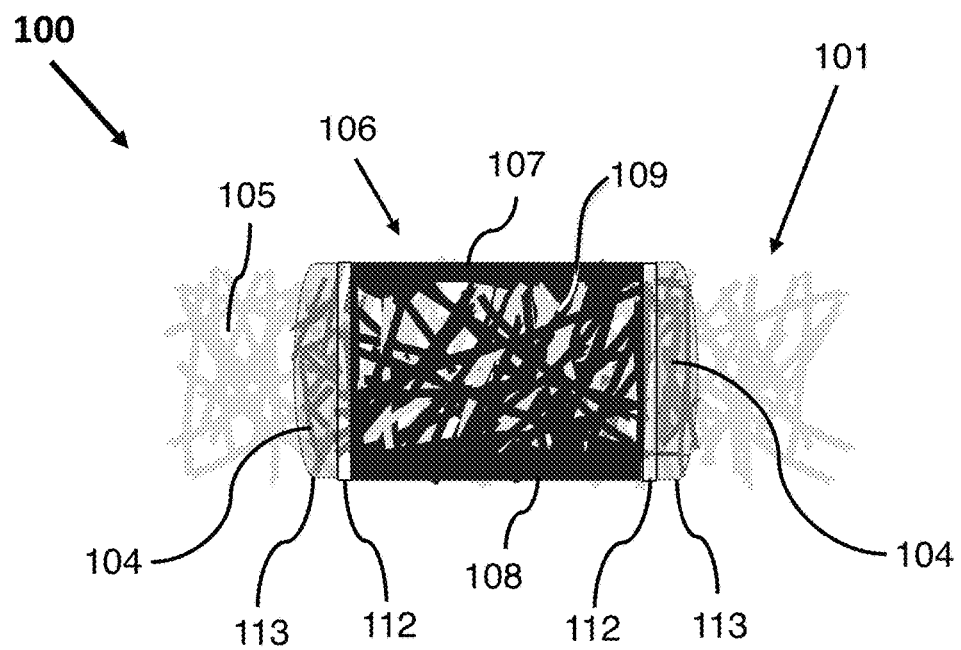

FIG. 1A-1B is a schematic diagram depicting a cross sectional view of exemplary embodiments of a membrane-supported thermoelectric composition 100 and thermoelectric elements 106. In the exemplary embodiment shown in FIG. 1A, membrane-supported thermoelectric composition 100 comprises porous membrane 101 having top face 102 and bottom face 103. In this exemplary embodiment, porous membrane 101 comprises membrane structural material 104 and open space or voids 105 dispersed among the structural material 104.

In some aspects, membrane structural material 104 may be fibrous or filamentous, as in the exemplary aspect shown in FIG. 1A-1B. In some aspects, membrane structural material 104 may have a shape or conformation that is not necessarily fibrous or filamentous such as but not limited to, spherical, cubical, rectangular, another geometrical shape, or a random or irregular shape. In some embodiments, membrane structural material is solid. It is to be noted that the terms "porous" and "pore", when used with "membrane matrix", and "membrane" refer to the voids or open spaces among the membrane structural material and do not refer to holes or pores in the membrane structural material itself.

As shown in FIG. 1A and FIG. 1B, electrically isolated thermoelectric element 106 comprises thermoelectric material 109 that is consolidated to form the thermoelectric element. Thermoelectric element 106 comprises a top 107 and a bottom 108. In some aspects, thermoelectric material 109 of element 106 extends through porous membrane 101 to membrane top face 102 and membrane bottom face 103. In these aspects, element top 107 is positioned at membrane top face 102 and element bottom 108 is positioned at membrane bottom face 103. In some aspects, element top 107, element bottom 108, or both may be positioned within porous membrane 101, such that consolidated thermoelectric material 109 and thermoelectric element 106 do not span the entire thickness 207 of porous membrane 101. Therefore, in some aspects the distance between element top 107 and element bottom 108 is less than thickness 207 of porous membrane 101. In some aspects, membrane structural material 104 is surrounded by thermoelectric material 109. Membrane structural material 104 surrounded by thermoelectric material 109 is represented here as blackened membrane structural material. (Lead line for 109 is shaded white within thermoelectric element 106, to enable a clear indication of the membrane structural material 104 surrounded by thermoelectric material 109.) In some embodiments, thermoelectric element 106 comprises thermoelectric material having a doping type selected to be n-type or p-type and is made from n-type or p-type thermoelectric material.

Thermoelectric element 106 comprises lateral faces 110 and 111, positioned on opposite sides of the thermoelectric element. In some aspects, as shown for thermoelectric element 106 at the right side of FIG. 1A, electrical contact material 112 may be positioned at one or both of thermoelectric element lateral faces 110, 111 and be in contact with thermoelectric material 109 that is along and on and surrounding membrane structural material 104, for electrically connecting selected thermoelectric elements. In some aspects such as depicted in FIG. 1A and FIG. 1B, electrical contact material 112 can extend from a position at or near element top 107 to a position at or near element bottom 108 of thermoelectric element 106. Also depicted in this example is optional solder layer 113, which in some aspects may be disposed to be in contact with electrical contact material 112, and may extend from a position at or near element top 107 to a position at or near element bottom 108. In FIG. 1A at right and in FIG. 1B both electrical contact material 112 and optional solder layer 113 are shown as extending about the entire distance from element top 107 to element bottom 108. In some embodiments, electrical contact material 112 and optional solder layer 113 (if present) may surround membrane structural material 104 of porous membrane 101. In FIG. 1B, electrical contact material 112 and solder layer 113 are depicted as partially transparent to show that, in some embodiments, electrical contact material 112 and solder layer 113 can be along and on and surrounding membrane structural material 104.

In some embodiments, thermoelectric material 109 in thermoelectric element 106 may extend through the porous membrane to one or both of membrane top face 102 and membrane bottom face 103. In some embodiments, thermoelectric material 109 is not exposed at membrane top face 102, at membrane bottom face 103, or at either membrane top face 102 or membrane bottom face 103. In some embodiments, electrical contact material 112 and/or optional solder layer 113 may not span the entire distance from element top 107 to element bottom 108. In some embodiments the amount, size, and/or shape of electrical contact material 112 at lateral faces 110 and 111 may be different. In some aspects, the amount, size, and/or shape of optional solder layer 113 contacting electrical contact material may be different at lateral face 110 from that at lateral face 111.

In some aspects, electrical contact material 112 and/or optional solder layer 113 may not span the entire thickness 207 of porous membrane 101.

In some aspects, porous membrane 101 may be chosen so that thermal conductivity of porous membrane 101 is kept low, such that the membrane structural material 104 can act as a barrier to heat flow between membrane top face 102 and membrane bottom face 103, thus enhancing the efficiency of the thermoelectric composition. In some embodiments, porous membrane 101 may have sufficient electrical insulation so that electrical shorting does not occur between thermoelectric elements 106 or across the porous membrane 101 so as to prevent thermal shorting across the porous membrane in regions remote from thermoelectric elements 106.

In some embodiments, porous membrane 101 may be a thin pliable sheet, film, or ribbon of flexible membrane structural material 104, such as for example only, a polymeric membrane web, a thin film of fiberglass such as a fiberglass membrane, an aerogel-fiberglass composite, or a fabric material to name a few.

In some embodiments, methods of making thermoelectric compositions and devices are provided. Methods may comprise delivering thermoelectric material 109 in the form of a dry powder, a powder slurry. or a powder ink to a selected location in porous membrane 101 and may also comprise using optical or photonic, sintering of the delivered thermoelectric material to form a consolidated thermoelectric element.

FIG. 2A-2D is a schematic diagram showing a cross section view of one embodiment of a method of making an exemplary membrane-supported thermoelectric composition 100. FIG. 2A depicts dispensing of thermoelectric material 109 in the form of a slurry (a slurry comprising thermoelectric powder diluted in a carrier fluid) onto a specific area of porous membrane 101 by dispensing unit 201. In some embodiments, thermoelectric material 109 for dispensing may be in the form of thermoelectric powder or thermoelectric powder mixed with or suspended in a liquid carrier and may be referred to herein interchangeably as "thermoelectric material", "powder", "slurry", or "ink". Material properties of thermoelectric material 109 for use in embodiments should be selected to be amenable for use with a given type of thermoelectric device and at an appropriate operational temperature for the given thermoelectric device. In principle, it is contemplated that any thermoelectric material presently known in the art or that may be discovered in the future can be employed in some embodiments of making a membrane-supported thermoelectric composition, provided that a thermoelectric powder or slurry can be made with the material and that the thermoelectric material 109 is capable of densification and reflow during sintering to form a continuous bulk phase with sufficient electrical conductivity and an electrical percolation pathway that supports sufficient current densities for thermoelectric applications. In some embodiments, it is desirable that thermoelectric material 109 be capable of forming microstructured and/or nanostructured thermoelectric grains along and on membrane structural material 104, during densification and reflow. In some embodiments, thermoelectric material 109 may be any of numerous high figure-of-merit (high-ZT) thermoelectric materials. Exemplary thermoelectric materials 109 include bismuth antimony tellurides, LAST compounds, half-Heusler compounds, silver, copper, and other transition metal tellurides and lead tellurides and silicon germanium for high temperature operation. Many other thermoelectric compounds with doping levels that impart selected Seebeck coefficients, current carrying capacities, and temperature ranges of operation may be useful in various embodiments. In some embodiments, particles of thermoelectric powders may be less than about 1 micron, i.e., particles of thermoelectric powders will have nanoparticle dimensions in these embodiments. In additional aspects, particles of thermoelectric powders may have dimensions less than about 500 nm, and in further aspects, particles of thermoelectric powders may have dimensions less than about 100 nm.

Numerous methods can be useful for dispensing thermoelectric material 109 as dry powder and slurries and include metered drop casting, aerosol jet, thermal spraying, and ink jet printing, to name a few. In some embodiments, contact pressure, alone or in combination with vibratory or ultrasonic action, may be employed during the dispensing step to enhance contact between thermoelectric material 109 and membrane structural material 104 and to move and embed thermoelectric material 109 further into porous membrane 101. In some embodiments, application of pressure and/or heat, such as for example by hot injection of a powder or slurry from a nozzle that can locally compress the membrane matrix, may occur along with the dispensing. In some aspects, an apparatus that includes an illumination element for optical sintering integrated with dispensing unit 201 and contact pressure unit can be used in methods of making a thermoelectric composition.

After dispensing onto the porous membrane, the slurry of thermoelectric material 109 disperses into voids 105 that are present among membrane structural material 104 within porous membrane 101, forming unconsolidated thermoelectric structure 202. In some embodiments, the porous membrane can have a porosity that enhances dispersion of thermoelectric powders or slurries into voids 105 among the membrane structural material 104. In some embodiments, porous membrane 101 can comprise a structural material 104 that is solid material and is surrounded by open spaces or voids 105. Porosity as used herein refers to open space around the structural material 104 of porous membrane 101 and does not refer to pores in the membrane structural material itself. In some aspects, since membrane structural materials may be solid fibers, membrane filling refers to filling at least some of the voids 105 among membrane structural material 104.

Figure 4A:
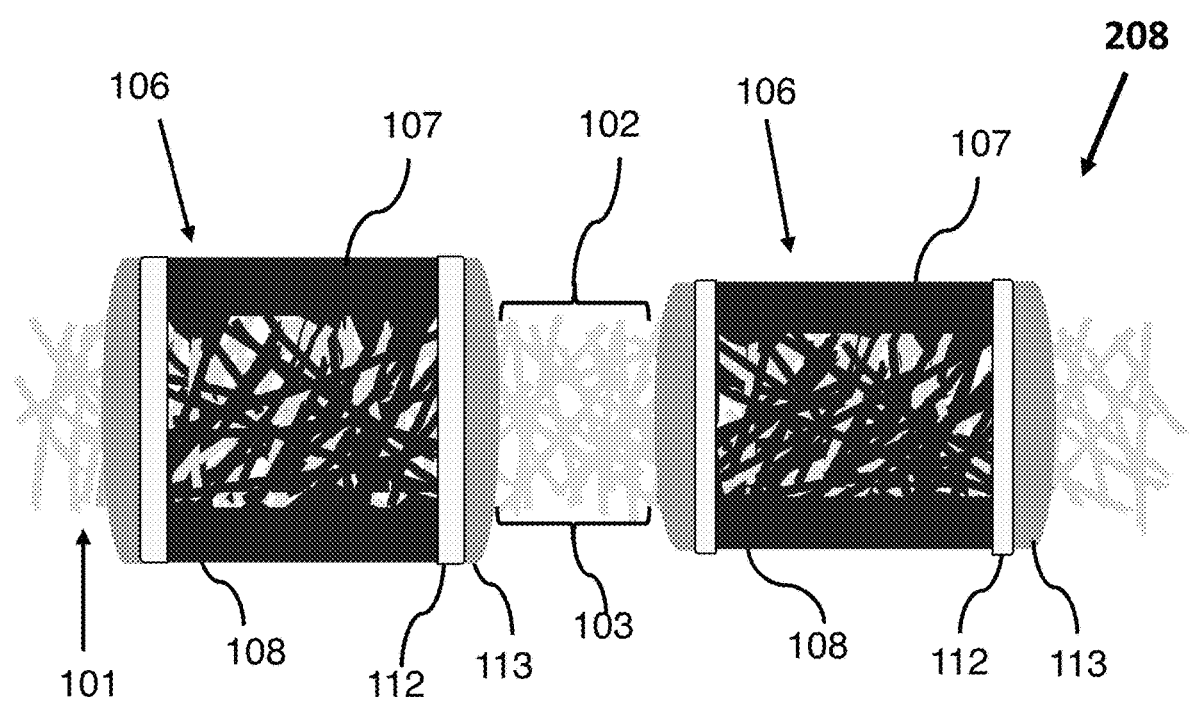
FIG. 4A-4C depict embodiments of thermoelectric elements.

In some embodiments, the dispersion of thermoelectric material 109 in one or more lateral directions can be controlled to manipulate the cross-sectional footprint of unconsolidated thermoelectric structure 202 and the shape and configuration of thermoelectric element 106. In some aspects, vertical depth of thermoelectric material 109 or the extent of penetration into porous membrane 101 may be controlled by adjusting the amount of a slurry of thermoelectric material 109 that is dispensed or the duration of the application of thermoelectric material 109 from dispensing unit 201. In some aspects, other factors that may be adjusted to control lateral and vertical dispersion of thermoelectric material 109 include the application of heat, mechanical pressure, vibration, ultrasonication, or combinations thereof during the dispensing step. In some embodiments, the lateral distribution and penetration depth of the thermoelectric material may be affected by the porosity of porous membrane 101, surface wetting and wettability of the membrane structural material 104, and interaction of the thermoelectric material with a solvent. In some embodiments, the physical size, shape, and/or configuration (e.g., cylinder, column, or solid rectangle) of thermoelectric element 106 and the geometrical arrangement of thermoelectric elements 106 in porous membrane 101 (e.g., square or hexagonal packing) may also be adjustable. Thermoelectric element 106 may span the entire thickness 207 (FIG. 2C) of porous membrane 101, may span a distance that is less than thickness 207, or may span a distance that is greater than thickness 207 (as depicted in FIG. 4A).

The pore size, pore distribution, structure, thickness, and other physical and chemical properties of porous membrane 101, (such as for example, wetting by a slurry of thermoelectric material 109 during the dispensing step, with any densifier or binding agents that may be used) can be important considerations for a thermoelectric cooling or energy generation format. In some embodiments, membrane thickness 207 generally ranges from about 0.1 mm to about 1 mm inclusive. In some aspects, membrane thickness 207 is from about 1 mm to about 10 mm, from about 10 mm to about 100 mm, from about 100 mm to about 1 cm or any range of thicknesses within the identified ranges. In some aspects thickness 207 can be from about 1 cm to about 10 cm, such as for example when a thermoelectric composition is used for recovering waste heat from a large structure.

In some embodiments, following the dispensing of thermoelectric material 109 into porous membrane 101 and dispersion of the slurry to form unconsolidated thermoelectric structure 202, unconsolidated thermoelectric structure 202 may be densified macroscopically prior to sintering and consolidation of thermoelectric material. In some aspects, not depicted in FIG. 2, pressure application, pre-baking, heating, or any combination of these may be employed prior to consolidation to compact or densify thermoelectric powders and remove any carrier fluid, solvent, and low molecular weight binders that may be present, yielding densified thermoelectric element 203 (FIG. 2B) that is dispersed in porous membrane 101. In some aspects heating may be performed, for example in a drying oven, and pressure may be applied, for example by dispensing unit 201 during the dispensing step or by a roller. In some aspects, a combination of heat and pressure (i.e., hot-pressing), during dispensing of or following dispersion of thermoelectric material, may be used prior to sintering. In some embodiments, hot pressing is combined with optical sintering of densified thermoelectric element 203. In some embodiments, no pressure or heat is applied.

Following any densification methods that may be performed, sintering can be used to fuse thermoelectric grains, present in densified thermoelectric element 203, into a consolidated bulk thermoelectric material, forming thermoelectric element 106 (also referred to herein as "consolidated thermoelectric element"). Thermoelectric element 106 forms a connected network within porous membrane 101 and is capable of conducting electricity. In some embodiments, any of various sintering methods such as hot pressing or spark plasma sintering can be used to consolidate thermoelectric material 109 into thermoelectric element 106.

In some aspects, photonic sintering may be used for preventing excessive heating of and damage to porous membrane 101. "Photonic" or "optical" sintering (or curing), as used herein, refers to the use of optical radiation to generate and apply heat to thermoelectric powders to effect sintering or fusing. In some embodiments used herein, photonic sintering comprises delivering optical irradiance with high optical power density over a wide lateral area, and within a thickness range compatible with embodiments described herein. Peak pulse energies delivered in such a fashion can result in local reflow of thermoelectric material 109 on membrane structural material 104, yet thermal dissipation is sufficiently rapid such that adjacent materials are not extensively heated or experience damage. Methods for the use of optical sintering for making flexible membrane thermoelectric compositions, assemblies, and devices are described in U.S. Pat. Pub. No. 20130218241, which is incorporated by reference herein in its entirety to provide support for the use of those methods in embodiments described herein.

Photonic sintering involves exposing densified thermoelectric element 203, in porous membrane 101, to irradiance 204 using lamp assembly 205 which controls emission from lamps 206 such that pulsed power duration delivered to densified thermoelectric element 203 results in reflow of thermoelectric material 109 and sintering without causing damage to porous membrane 101. In some embodiments, photonic sintering is used in the absence of heat or pressure for consolidating thermoelectric structure 202 or densified thermoelectric element 203. In some embodiments, the application of electric current, may be used alone or in combination with heat, pressure, or photonic sintering to consolidate thermoelectric structure 202 or densified thermoelectric element 203.

In some aspects, photonic sintering is used for consolidating densified thermoelectric element 203 into (consolidated) thermoelectric element 106 that is dispersed within and/or across porous membrane 101. Densified thermoelectric elements 203, which are under irradiance 204 during a fixed exposure profile (e.g., exposure duration, lamp 206 pulse rate, power density, etc.), form consolidated thermoelectric elements 106 (FIG. 2C). In the embodiment shown in FIG. 2B, exposure to optical radiation is shown to occur at top face 102 of porous membrane 101. In some embodiments, optical radiation may be applied at both top face 102 and bottom face 103 of porous membrane 101 and at any angle that supports consolidation of thermoelectric material 109. During the sintering process, the bulk material properties of electrical conductivity, thermal conductivity, and Seebeck coefficient necessary to support high-ZT thermoelectric efficiency are generated within consolidated thermoelectric element 106.

Porous membrane 101 provides structural support during dispensing and consolidation of thermoelectric material and possesses physical and chemical properties that support optical sintering of thermoelectric material within the porous membrane and material that may be outside of the porous membrane. Porous membrane 101 may be selected to have a porosity that provides for densification of thermoelectric material and adequate penetration of sintering light by virtue of guiding and scattering of the light through and off the membrane structural material 104. The transparency of the membrane with respect to the irradiance spectrum influences the degree to which light can penetrate the membrane and be absorbed by thermoelectric material embedded within the membrane. The relative solid volume fraction can also influence light scattering. For example, in some embodiments a higher density of membrane structural material 104 may produce more scattering and affect the degree of light penetration into porous membrane 101. In some embodiments, membrane structural material 104 may act as a guide for directing light into the membrane, where it can be absorbed by particles of thermoelectric material 109 that are deeper in the membrane. Photonic sintering lamp assemblies 205 for use in some embodiments of the invention are available from Novacentrix (Austin, Tex.) and are marketed as Pulseforge® tools. In some embodiments, multiple lamp assemblies may be used to sinter densified thermoelectric element 203.

In some embodiments, membrane structural material 104 may be selected for its ability to act as a standoff thermal insulating material that is flexible or conformable. Wettability of membrane structural material can also serve as a means to prevent electrical material deposition such as during tinning of solder to specific individual thermoelectric elements formed in the membrane.

In addition to providing support for dispersed thermoelectric material 109, membrane structural material 104 may act as a collection matrix during optical sintering when rapid heating can induce reflow (fusing) of thermoelectric material. In some embodiments, optical sintering methods can cause softening of densified thermoelectric element 203. In some embodiments, full melting and reflow of thermoelectric material 109 may occur during sintering of individual microcrystalline and nanocrystalline domains of densified thermoelectric element 203. In this regard, "melted" densified thermoelectric element 203 may wet the surface of membrane structural material 104 and thermoelectric material 109 may then flow in such a fashion as to coat and surround membrane structural material 104, depicted as black fibers in FIG. 2C-2E. Reflow provides a means for thermoelectric particles to accumulate (i.e., increase in density) along and on the membrane structural material. In some aspects, as heat is dissipated, individual microcrystalline and nanocrystalline domains can form along and on membrane structural material as a result of the wetting or de-wetting of the membrane structural material 104 (not shown in FIG. 2C, and described further in FIG. 3). The formation of microstructured and nanostructured thermoelectric material (grains) along and on and surrounding membrane structural material 104 is the result of the interplay between surface tension and cohesive/adhesive forces of both the membrane structural material 104 and the thermoelectric material 109.

Matrix structural material can be selected to have more or less wettability and may be selected to enhance interaction with reflowing thermoelectric material. In some embodiments, the surface of matrix structural material 104 may facilitate wetting during reflow and hence assist in further densification of densified thermoelectric element 203 by virtue of a change in the material phase from solid to liquid form. Thermoelectric material may be partially liquefied and then solidify, as in a sintering process, but at least some particles may be totally melted and then re-solidify upon cooling after being influenced by the wetting properties of the matrix while in liquid form. As such, in some embodiments, wetting properties of membrane structural material 104 can influence the microcrystalline/nanocrystalline structure of consolidated thermoelectric element 106 and may enhance the in situ formation of thermoelectric microstructures and/or nanostructures, such as for example microstructured and/or nanostructured thermoelectric grains, along and on and surrounding membrane structural material during energy dissipation (cooling). The formation of nanostructured thermoelectric regions may serve to enhance the thermoelectric figure of merit of the sintered bulk materials, providing the beneficial properties of quantum confinement and high interface phonon scattering. The structure and dimensions of consolidated thermoelectric elements 106 can be tailored by selection of specific wetting properties of membrane structural materials and the irradiance flux on the system.

In some embodiments, consolidated thermoelectric elements 106 can comprise a combination of thermoelectric material along and on and surrounding structural material of porous membrane 101 and bulk interconnected thermoelectric material attached to the structural material and present within voids dispersed among the membrane structural material. This structure collectively acts to carry current across the thermoelectric membrane. Bulk electrical transport across the membrane is mediated only through the consolidated thermoelectric elements 106 in the membrane. Fusion or sintering of crystalline domains of the thermoelectric material along and on and surrounding membrane structural material provides a means to ensure consolidation of high thermoelectric figure of merit materials such that high electrical transport across the membrane is achieved.

In some aspects, the amount of residual void space in the porous membrane (i.e., the open volume of the porous membrane) may be selected for a particular purpose. The amount of residual void space remaining in porous membrane 101, after consolidation of thermoelectric material 109, is influenced by the original volume of the thermoelectric material 109 deposited in porous membrane 101, any pre-consolidation macroscopic densification processes such as external contact, the sintering/consolidation process, and the number of consecutive applications/optical sintering processes used in making the consolidated thermoelectric elements 106. In some embodiments of the invention, additional thermoelectric material 109 may be dispensed at locations in porous membrane 101, where thermoelectric elements 106 have been previously consolidated, and may subsequently be sintered and consolidated to make a thermoelectric element 106 having a final selected density of thermoelectric material. Thermoelectric material may also be added to different locations within porous membrane 101 and consolidated to adjust the distribution of thermoelectric elements 106 in the membrane.

Regions of porous membrane 101 where consolidated thermoelectric elements 106 are not formed (i.e., where no thermoelectric material is dispensed) are electrically insulating. Electrical isolation is ensured for neighboring thermoelectric elements 106 not in contact with each other and across the thickness of porous membrane 101. Therefore, embodiments of the disclosure provide a means to create thermoelectric elements 106 directly within a supporting porous membrane 101 that limits electrical flow to only those regions with consolidated thermoelectric elements 106. The use of a low density porous membrane matrix provides for low thermal conductance across the membrane, and thus, heat flow is also concentrated in the thermoelectric elements that have been consolidated within the membrane. The ability to consolidate thermoelectric elements 106 in situ within a supporting membrane 101 simplifies thermoelectric device production.

In some embodiments, membrane-supported thermoelectric subassembly 100 comprises a flexible porous membrane 101 comprising structural material 104 and voids 105 and having a membrane top face 102 and a membrane bottom face 103; a plurality of electrically isolated thermoelectric elements 106, each element comprising a top 107, a bottom 108, a first lateral face 110, a second lateral face 111, the lateral faces positioned on opposite sides of each thermoelectric element 106, and thermoelectric material 109 positioned at least partially within the membrane and along and on and surrounding structural material 104 of the membrane; and electrical contact material 112 disposed at the lateral faces for electrically connecting selected thermoelectric elements, the electrical contact material being along and on and surrounding structural material of the membrane, wherein each element has a doping type selected to be n-type or p-type. This embodiment of a membrane-supported thermoelectric composition 100 may also be referred to as a membrane-supported thermoelectric subassembly 208 (FIG. 2D).

In some embodiments, electrical contact material 112 is deposited on lateral faces 110 and 111 at opposite sides of consolidated thermoelectric element 106 (FIG. 2D) and is in physical contact with thermoelectric material 109, for making an electrical connection. In some aspects, electrical contact material 112 may extend through porous membrane 101 to element top 107 and element bottom 108. In some aspects, electrical contact material and solder (if present) may not extend the entire distance from element top 107 to element bottom 108.

In some embodiments, membrane-supported thermoelectric subassembly 208 further comprises solder layer 113 adjacent to electrical contact material 112, such that electrical contact material 112 is positioned between thermoelectric element 106 and solder layer 113. A membrane-supported thermoelectric composition 100, after deposition of electrical contact material 112 and optional solder layer 113 is shown in FIGS. 1A, 1B, and 2E. In these exemplary embodiments, solder layer 113 is adjacent to and in contact with electrical contact material 112, such that electrical contact material 112 is positioned between thermoelectric element 106 and solder layer 113. In the embodiment show in FIG. 2E, solder layer 113 extends through porous membrane 101 to element top 107 and element bottom 108. In some embodiments, electrical contact material 112 for making external electrical contacts is a low contact resistance material such as nickel or indium. In some aspects, membrane structural material 104 can act as a solder mask during deposition of the low contact resistance material and the solder. Electrical contact material 112 may be deposited using well-known methods such as electroless or vacuum deposition. In some aspects, deposition of solder layer 113 may be carried out using a reflow oven where porous membrane 101 may act as a wetting barrier to solder 113 analogous to solder masks used for making electronics boards. In some embodiments, methods for deposition of electrical contact material 112 and solder layer 113 include selective application on the consolidated thermoelectric elements using a printing technique or conversely using a mask to restrict application of the electrical contact material 112 and optional solder layer 113 to the consolidated thermoelectric elements.

In many embodiments, electrical contact material 112 and solder layer 113 (when present) are present along and on and surround membrane structural material 104 of porous membrane 101. By surrounding membrane structural material 104, this arrangement can enhance the structural integrity of the physical contact between electrical contact material 112 and consolidated thermoelectric material in thermoelectric element 106 and between electrical contact material 112 and membrane structural material 104. In some aspects, this novel structure can inhibit delamination of electrical contact material 112 from lateral faces 110, 111 of thermoelectric element 106.

In many embodiments thermoelectric elements 106 having electrical contact material 112 positioned at lateral faces 110, 111 are connected with neighboring thermoelectric elements by porous membrane 101. Regions of porous membrane 101 in which consolidated thermoelectric elements are not present (i.e., where no thermoelectric material or electrical contact material is dispensed) are electrically insulating. In some embodiments, selected thermoelectric elements or groups of elements 106 in thermoelectric subassembly 208 may be electrically connected by electrodes comprising electrical contact material. Embodiments may include designs for a single electric circuit path, or alternatively multiple circuit paths that can be independently actuated. Registration of electrodes is selected such that electrical connectivity is maintained between selected consolidated thermoelectric elements 106. In some aspects, solder layer 113 may serve as a bonding intermediary for electrical connectivity. Thermoelectric subassembly 208 may be configured with current input and current exit leads for generating electricity or for cooling/heating depending on the selected mode of operation.

In some embodiments, one or more thermal interface films may be applied to thermoelectric subassembly 208. Thermal interface films may comprise single and/or multiple thermal interface material layers. In some embodiments, a thermal interface film may comprise two layers comprising a thermal transport layer (e.g., a metal foil with high thermal conductivity such as copper or aluminum, noble metals, refractory metals and other non-metal or composites with high thermal conductivity). In some embodiments, a thermal interface film may include electrically insulating ceramic such as Alumina or AlN laminated with a thin electrically insulating layer (e.g., a polyimide film, for example Kapton®; E. I. du Pont de Nemours and Co., Wilmington, Del., USA). In some embodiments, such as when ease and cost of manufacturing are considerations, a thermal interface film may comprise a polymer film alone wherein the overall thickness is kept low to keep thermal conductivity high. In some aspects, a ceramic sheet such as AlN or ceria may be a thermal interface film. In additional aspects, an electrically insulating layer may comprise a high thermal conductivity material such as aluminum nitride that is deposited using vacuum deposition techniques such as sputtering. An electrically insulating layer serves to electrically isolate a thermal transport layer from electrodes and provides low thermal resistance. Thermal interface films, their structures and compositions, and methods for making and using thermal interface films with membrane-supported thermoelectric subassemblies are described in U. S. App. Pub. No. 20130218241 (Savoy et al.), which is incorporated by reference herein in its entirety to provide support for these embodiments.

In some embodiments, registration and stacking of multiple membrane-supported thermoelectric assemblies 208 (with or without solder layer 113) may be used for increasing thermoelectric efficiency of a thermoelectric device. In some embodiments, stacking multiple membrane-supported thermoelectric subassemblies 208 may be accomplished by registering and bonding electrical contact material 112 or solder 113 from one consolidated thermoelectric element 106 directly to another consolidated thermoelectric element 106 in an adjacent membrane-supported thermoelectric subassembly 208. Methods for assembling thermoelectric devices using multiple registered and stacked membrane-supported thermoelectric subassemblies 208 are described in U. S. App. Pub. No. 20130218241 (Savoy et al.).

In some embodiments an apparatus useful for manufacturing membrane-supported thermoelectric compositions can comprise a roll-to-roll system. The use of a roll-to-roll system for manufacturing membrane-supported thermoelectric subassemblies is described in U. S. App. Pub. No. 20130218241 (Savoy et al.). In some aspects, a roll-to-roll apparatus may comprise a dispenser, a means to apply contact pressure, a means to apply heat, a means to impart optical sintering, a means for depositing electrical contact material, or any combination of these. The use of a roll-to-roll system is not a requirement for manufacturing thermoelectric compositions and subassemblies of the invention.

FIG. 3A-3E is a series of scanning electron photomicrographs depicting the results of photonic sintering of dispensed thermoelectric material into consolidated thermoelectric material. The porous membrane 101 used in this exemplary embodiment comprised a blend of polymers and glass and is sold under the trademark name FUSION 5™ (Whatman Inc., Piscataway, N.J., USA). The FUSION 5™ membrane is just one example of many possible membrane types that may be used for porous membrane 101. SEM photomicrograph in FIG. 3A shows membrane structural material 104 in porous membrane 101 prior to addition of thermoelectric material into the porous membrane. (The view in the photomicrograph is mostly of the top face of the membrane structural material 104. A cross-section slice of the membrane is visible at the lower left of the photomicrograph. The membrane thickness 207 is indicated by the bracket.) Exemplary voids 105 among the matrix structural material 104 are indicated in the lower right of FIG. 3A. It is clear from the photomicrograph that voids 105 are empty space amongst the membrane structural material 104. FIG. 3B shows porous membrane 101 after the deposition of thermoelectric material into the membrane and after photonic sintering. FIG. 3B illustrates one aspect in which low volumetric fill of thermoelectric material was introduced into the porous membrane, and only the largest thermoelectric grains 302 formed during optical sintering can be seen in the image. In contrast, SEM photomicrograph FIG. 3C illustrates another aspect in which a large volumetric fill of thermoelectric material was deposited into porous membrane 101. In this exemplary embodiment, a large degree of bulk phase material can be seen and membrane structural material (fibers in this example) 104 of porous membrane 101 are surrounded by thermoelectric grains 302 formed from deposited thermoelectric material. The boundary 303 (represented by the dashed white line) is between a region of porous membrane 101 into which thermoelectric material was deposited and sintered (left side of photomicrograph) and a region in which no thermoelectric material was introduced (right side) and can be seen in the cross-section image which depicts porous membrane 101 adhered to stage 304 by copper tape 305.

Reflow and recrystallization dynamics can be influenced by the volume and amount of thermoelectric material dispensed into porous membrane 101. In FIG. 3D, the volume of thermoelectric material deposited was low relative to the total void fraction of the porous membrane. In this embodiment, thermoelectric material slurry can reflow during photonic sintering. If a porous membrane comprises wettable structural material (e.g., wettable fibers) 104, the liquid formed during the sintering process from melted thermoelectric material 104 will wet the surfaces of and flow along membrane structural material 104. After heat dissipation, the magnitude of the cohesive forces in the fluid thermoelectric phase and the adhesive, or wetting forces on the matrix structural material 104 resulted in the formation of electrically conducting sintered microstructured and nanostructured grains 302 of thermoelectric material. The formation of nanostructured thermoelectric domains provides enhanced thermoelectric efficiency due to increased phonon scattering and quantum confinement effects. Inset SEM photomicrograph FIG. 3E illustrates a segment of a single membrane structural material fiber 104 of porous membrane 101 having electrically conducting microstructured and nanostructured thermoelectric grains 302 along and on and surrounding structural material (fibers here) 104 of the porous membrane.

In some embodiments, the dispersion of thermoelectric material 109 can be controlled to manipulate the cross-sectional footprint of unconsolidated thermoelectric structure 202 and thereby the shape and configuration of thermoelectric element 106. For embodiments depicted in FIGS. 1 and 2, the cross-sectional area of thermoelectric element 106 is shown as being largely rectangular. In those figures, the three-dimensional shape of the element in the porous membrane is substantially that of a rectangular prism, and lateral faces 110 and 111 correspond to opposite lateral sides of the rectangular prism. Lateral faces 110 and 111 correspond to regions of a thermoelectric element 106 that represent the boundary between the region of thermoelectric element 106 having membrane structural material 104 that is surrounded by thermoelectric material 109 and the adjacent region of porous membrane 101 having membrane structural material 104 not surrounded by thermoelectric material 109. In some aspects, thermoelectric elements 106 are positioned next to each other, adjacent but not necessarily touching, such that lateral faces 110 and 111 of adjacent elements are substantially across from each other in porous membrane 101 (FIG. 2C-2E). In these aspects, the thermoelectric elements are said to be positioned in an "end-to-end" configuration.

In some embodiments, thermoelectric elements are shaped differently. For example, a substantially cylindrically shaped thermoelectric element 106, having a circular top 107 and bottom 108, may have lateral faces 110 and 111 that are regions on the curved surface of the substantially cylindrically shaped thermoelectric element and that are positioned on opposite sides of the cylinder from one another. Lateral faces 110 and 111 serve as the electrical interface for each consolidated thermoelectric element 106 in porous membrane 101.

Figure 4B:
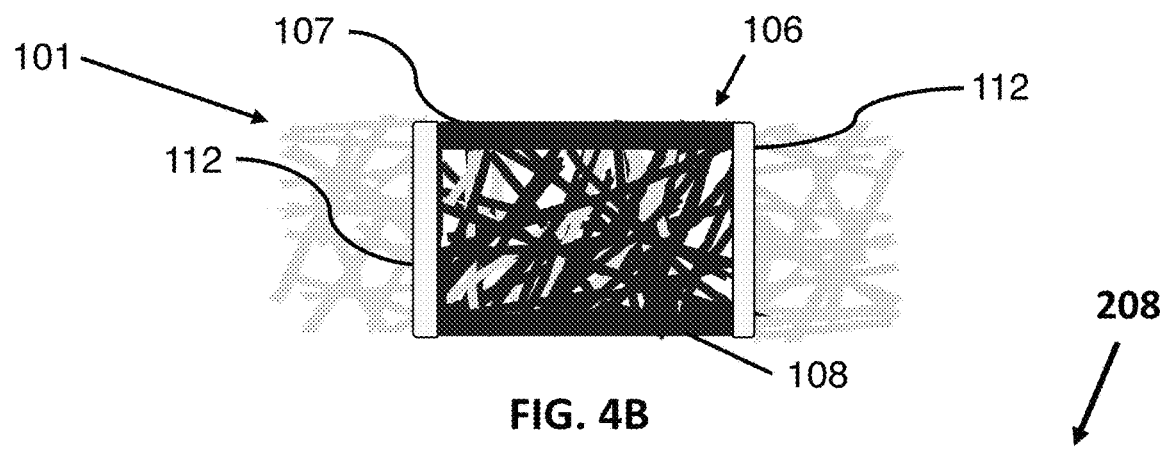
Figure 4C:
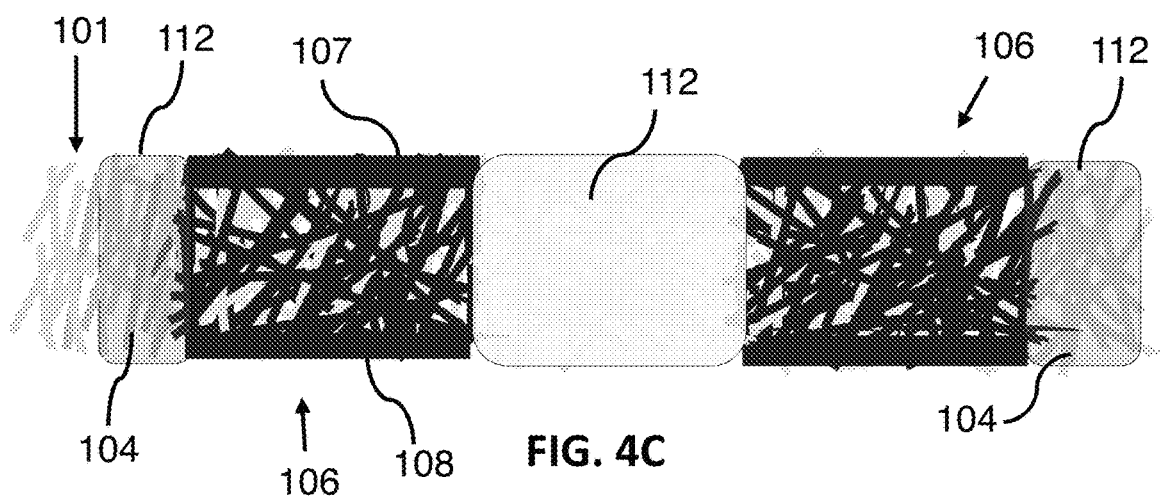

FIG. 4A-4C depict various embodiments of thermoelectric element 106 and thermoelectric subassembly 208. Thermoelectric elements may be any of a variety of shapes and sizes. In some embodiments, it is not a requirement that all thermoelectric elements 106 that are present in the same porous membrane 101 or in the same thermoelectric subassembly 208 have the same shape or dimensions or that they all have the same configuration in the porous membrane.

In some aspects, thermoelectric element 106 may comprise consolidated thermoelectric material 109 that is positioned outside porous membrane 101, such that element top 107, element bottom 108, or both element top and element bottom are positioned outside porous membrane 101. An element top or bottom that is outside porous membrane 101 is not within the porous membrane. FIG. 4A is a schematic diagram of a thermoelectric element 106 in which element top 107 and element bottom 108 are positioned outside porous membrane 101 and extend beyond membrane top face 102 and membrane bottom face 103. Thermoelectric element 106 at the left side of FIG. 4A extends further beyond membrane top face 102 and membrane bottom face 103 than does the element shown at the right side of FIG. 4A. Thermoelectric elements 106 shown in FIG. 4A each comprise thermoelectric material, within porous membrane 101, that is along and on and surrounding structural material 104 of the porous membrane and thermoelectric material 109 that is outside porous membrane 101. In the embodiments depicted in FIG. 4A, electrical contact material 112 and solder layer 113 extend to element top 107 and element bottom 108. However, in some aspects electrical contact material 112, and solder layer 113 if present, may not extend beyond and/or may not extend the same distance beyond membrane bottom face 103 or membrane top face 102 as do element top 107 and element bottom 108.

In some embodiments, solder layer 113 may be absent. In these embodiments, only electrical contact material 112 is deposited at lateral faces 110, 111 of thermoelectric element 106. FIG. 4B shows an exemplary embodiment of thermoelectric element 106 that lacks solder layer 113. In some embodiments, such as that depicted in FIG. 4C, when no solder layer 113 is present on thermoelectric element 106, electrical contact material 112 may span the entire distance between lateral faces of adjacent thermoelectric elements that are positioned end-to-end and be in physical contact with a lateral face on one thermoelectric element 106 that is across from the lateral face on the adjacent thermoelectric element, such that the adjacent thermoelectric elements positioned end-to-end are electrically connected. In this schematic diagram (FIG. 4C), electrical contact material 112 at the outside lateral face of each thermoelectric element is depicted as partially transparent to demonstrate that electrical contact material 112 surrounds structural material 104 of porous membrane 101. The electrical contact material 112 spanning the distance between the element lateral faces that are across from each other also surrounds structural material 104 of porous membrane 101.

The thermoelectric elements 106 of subassembly 208 depicted in FIG. 4C are positioned end-to-end in porous membrane 101 so that a lateral face from each thermoelectric element is positioned across from a lateral face on an adjacent thermoelectric element. As such, the thermoelectric elements are said to be linearly aligned end-to-end or substantially linearly aligned end-to-end when the membrane is in a flattened or extended position. This conformation is also shown in FIG. 1A, FIG. 2D, and FIG. 2E.

Figure 5A:
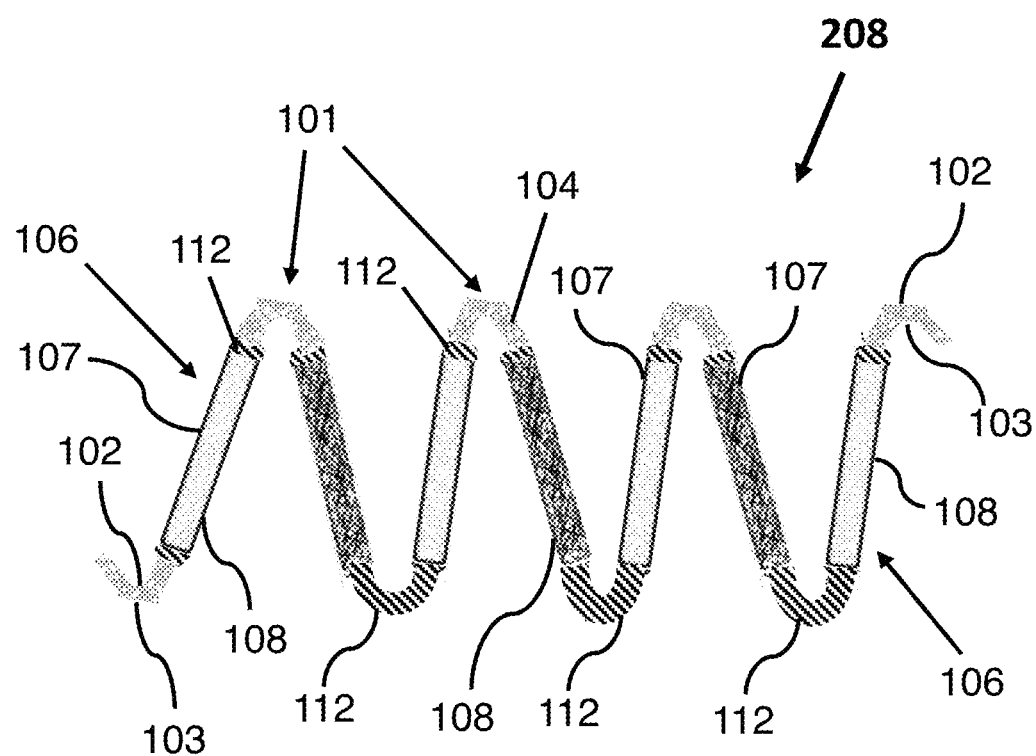
FIG. 5A-5B depict a thermoelectric assembly bent into a Z-form shape and a Z-form serpentine manifold assembly housing a flexible porous membrane.
Figure 5B:
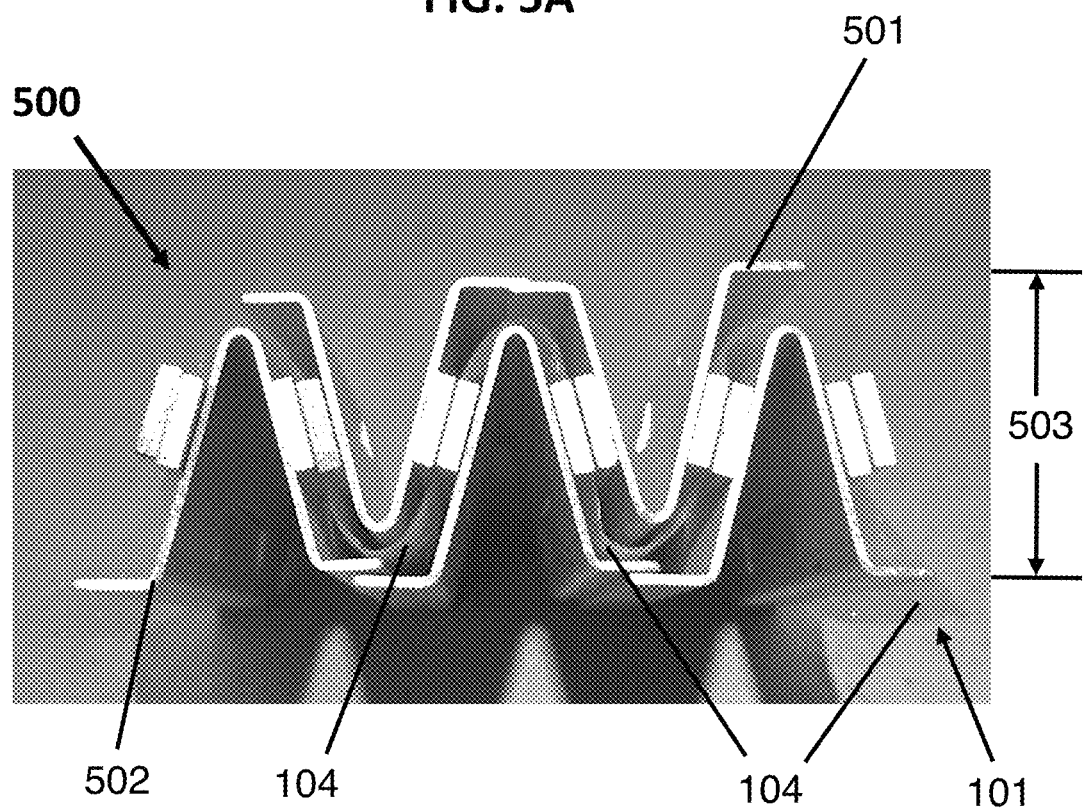

FIG. 5A-5B depicts an embodiment of a thermoelectric subassembly 208 bent into a Z-form shape (FIG. 5A) that can be positioned in a Z-form manifold and a Z-form serpentine manifold assembly housing a flexible porous membrane 101 (FIG. 5B). FIG. 5A is a schematic cross-sectional view of one embodiment of thermoelectric subassembly 208 having seven thermoelectric elements 106 and bent into a Z-form structure. In some aspects, this configuration facilitates bending a conformal flexible thermoelectric composition while maintaining a favorable positioning of the thermoelectric elements for electrical connection and optimal performance. In this exemplary embodiment, the thermoelectric elements are disposed in a continuous section of porous membrane 101 and are connected to one another by segments of the continuous porous membrane 101. When porous membrane 101 is in a flattened or extended position (i.e., when the Z-form structure is expanded), the elements are substantially linearly aligned end-to-end, such that a lateral face from each thermoelectric element is positioned across from a lateral face on an adjacent thermoelectric element. Thermoelectric elements 106 comprise either n-type (light shading) or p-type (dark shading) thermoelectric material 109 surrounding the membrane structural material 104 of porous membrane 101. Each element extends through membrane 101 to element top 107 and element bottom 108. At the lower part of FIG. 5A, for selected adjacent thermoelectric elements, electrical contact material 112 spans the entire distance from a lateral face on a first thermoelectric element to a lateral face on an adjacent second thermoelectric element to contact each thermoelectric element, and the electrical contact material 112 surrounds membrane structural material 104. At the upper part of FIG. 5A, electrical contact material 112 is disposed at lateral faces of thermoelectric elements and surrounds membrane structural material 104, but in this part of the subassembly a segment of membrane structural material 104 not surrounded by electrical contact material is present between adjacent thermoelectric elements 106. In this exemplary embodiment, the distance between first and second lateral faces of a thermoelectric element is larger than the thickness 207 of porous membrane 101 (i.e., the distance between matrix top face 102 and matrix bottom face 103). In some embodiments, as depicted here in FIG. 5A, electrical contact material 112 is flexible and can be bent to accommodate the needs of a thermoelectric device. In some aspects, thermoelectric element 106 may also be flexible and may be bent to conform as needed.

FIG. 5B is a photograph of a Z-form serpentine manifold assembly housing a flexible porous membrane 101. The Z-form manifold is readily segmented such that the number and size of upper 501 and lower 502 frame members can be adjusted to accommodate a selected thermoelectric device. In the exemplary aspect depicted here, distance 503 may range from about 5 mm to about 10 mm and can be adjusted for a selected thermoelectric device. In some embodiments, structural frame members 501, 502 may be used for making electrical connections between thermoelectric elements. The Z-form structure may be used in some embodiments to improve cooling or heating power density or energy recovery density. In some embodiments, membrane thickness 207 may be up to about 10 cm. Therefore, in some aspects distance 503 may be as large as is necessary to accommodate the thickness 207 of membrane 101 and the required Z-form dimensions for a specific application. One exemplary application of a large-dimensioned membrane and manifold is for the recovery of waste heat from large structures.

The porous nature and flexibility of the thermoelectric compositions described herein enable new applications for lightweight, high surface area thermoelectric devices. Exemplary applications include recovery of waste heat from pipes and vehicular components with large temperature differences from ambient and body contact cooling. Flexible thermoelectric compositions, subassemblies, and devices will enable the development of breathable fabrics for clothing and other applications. Devices may include multiple subsystem circuits for staggering the cooling energy to different microdomains in contact with a human or animal body part. In some embodiments, this can be useful for countering vasoconstriction-induced heat flow restriction during active cooling of skin. In some embodiments, a conformable thermoelectric bandage may comprise thermoelectric compositions and devices described herein and are envisioned for controlling heating and cooling for treatment of injuries or induced hypothermia. For example, in some aspects a thermoelectric device built with a flexible membrane as disclosed herein may be wrapped around a human or animal limb, with a battery connected to the device. In some aspects an elastic band may be wrapped over the device or the flexible thermoelectric device itself can be manufactured to be both conformable and self-securing. Activation of the device using the battery may heat or cool the area encompassed by the device. Cycling of heating and cooling may also be applied simply by reversing the polarity of the current applied. In some aspects, the flexible membrane wrapped around a limb may be connected to a thermal management system that performs heat exchange with ambient surroundings or liquid.

Membranous strips, ribbons, or sheets can be used for making numerous types of flexible and conformable membrane-supported thermoelectric compositions of the invention. The registration and combination of various membrane-supported thermoelectric compositions and subassemblies with electrode-bearing thermal interface strips, ribbons, films or sheets allows for fabrication of various membrane-supported thermoelectric modules that can be further combined to fabricate conformable and flexible thermoelectric generator and cooler devices for numerous energy recovery and cooling applications.

Thermoelectric devices refer broadly to solid-state devices with assembled thermoelectric elements. In some embodiments, thermoelectric devices comprise one or a plurality of thermoelectric subassemblies disclosed herein. Thermoelectric compositions and subassemblies described herein may be flexible and conformable to a surface on which the device may be applied, whether a device is being cooled directly or has a temperature differential that is used to generate an electric current in the device. It is contemplated that the thermoelectric devices may be used to cool any surface that is part of any material. In some embodiments, non-limiting examples of surfaces that may be cooled by thermoelectric cooling devices include parts of an animal or human body where comfort requirements dictate a certain device porosity or breathability that provides for circulation of ambient air, detectors for electromagnetic radiation or other diagnostic sensors, automotive car seats, beverage coolers or mattresses. In some aspects, thermoelectric compositions and devices can be used for wrapping waste heat pipes, drains or other industrial process control devices. In some aspects, thermoelectric compositions and devices described herein can be useful for generating energy such as for spacecraft and satellite energy generation. Furthermore, applications for thermoelectric compositions and devices described herein include thermal energy scavenging in conjunction with other renewable energy collection such as photovoltaics, solar thermal, wind, nuclear, and isotopic decay.

What is claimed is:

1. A membrane-supported thermoelectric subassembly comprising:
   (a) a flexible porous membrane comprising structural material and voids and having a top face and a bottom face;
   (b) a plurality of electrically isolated thermoelectric elements, each thermoelectric element in the plurality of thermoelectric elements having a doping type selected to be n-type or p-type and comprising;
      i) a top and a bottom,
      ii) a first lateral face and a second lateral face, the first and second lateral faces positioned on opposite sides of the each thermoelectric element; and
      iii) thermoelectric material positioned at least partially within the membrane and along and on and surrounding structural material of the membrane, wherein the thermoelectric material extends through the membrane to the membrane top face and the membrane bottom face; and
   (c) electrical contact material in physical contact with the first and second lateral faces of the each thermoelectric element for electrically connecting selected thermoelectric elements in the plurality of thermoelectric elements, the electrical contact material being along and on and surrounding structural material of the membrane.

2. The thermoelectric subassembly of claim 1 wherein the electrical contact material in physical contact with the first and second lateral faces extends from the top to the bottom of the each thermoelectric element in the plurality of thermoelectric elements.

3. The thermoelectric subassembly of claim 1 further comprising a first solder layer in physical contact with the electrical contact material in physical contact with the first lateral face of the each thermoelectric element in the plurality of thermoelectric elements and a second solder layer in physical contact with the electrical contact material in physical contact with the second lateral face of the each thermoelectric element in the plurality of thermoelectric elements such that the electrical contact material in physical contact with the first lateral face is positioned between the each thermoelectric element and the first solder layer and the electrical contact material in physical contact with the second lateral face is positioned between the each thermoelectric element and the second solder layer.

4. The thermoelectric subassembly of claim 1 wherein the structural material is solid.

5. The thermoelectric subassembly of claim 1 wherein the electrical contact material in physical contact with the first and second lateral faces of the each thermoelectric element comprises a low resistance contact material.

6. The thermoelectric subassembly of claim 1 wherein the thermoelectric material comprises microstructured and/or nanostructured thermoelectric grains.

7. The thermoelectric subassembly of claim 1 further comprising a thermal interface film.

8. The thermoelectric subassembly of claim 1 wherein the each thermoelectric element in the plurality of thermoelectric elements are flexible.

9. The thermoelectric subassembly of claim 1 wherein the electrical contact material in physical contact with the first and second lateral faces of the each thermoelectric element is flexible.

10. A thermoelectric device comprising a thermoelectric subassembly of claim 1.

11. The thermoelectric subassembly of claim 1 wherein the plurality of thermoelectric elements are linearly aligned end-to-end.

12. The thermoelectric subassembly of claim 11 wherein the electrical contact material in physical contact with the first and second lateral faces of the each thermoelectric element spans the entire distance between adjacent thermoelectric elements in the plurality of thermoelectric elements.

13. The thermoelectric subassembly of claim 11 wherein the electrical contact material in physical contact with the first and second lateral faces of the each thermoelectric element is flexible.

14. The thermoelectric device of claim 10 wherein the thermoelectric subassembly is positioned in a Z-form manifold.

15. A thermoelectric device comprising a plurality of thermoelectric subassemblies of claim 1, registered and bonded to form a subassembly stack.

* * * * *

UNITED STATES PATENT AND TRADEMARK OFFICE
CERTIFICATE OF CORRECTION

| | | |
|---|---|---|
| PATENT NO. | : 11,152,556 B2 | Page 1 of 1 |
| APPLICATION NO. | : 16/048337 | |
| DATED | : October 19, 2021 | |
| INVENTOR(S) | : Savoy et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 74 days.

Signed and Sealed this
Thirty-first Day of January, 2023

*Katherine Kelly Vidal*

Katherine Kelly Vidal
*Director of the United States Patent and Trademark Office*